United States Patent
Ho et al.

(10) Patent No.: US 9,029,958 B2
(45) Date of Patent: May 12, 2015

(54) FINFETS AND THE METHODS FOR FORMING THE SAME

(71) Applicant: Taiwan Semiconductor Manufacturing Company, Ltd., Hsin-Chu (TW)

(72) Inventors: Chia-Cheng Ho, Hsin-Chu (TW);
Tzu-Chiang Chen, Hsin-Chu (TW);
Yi-Tang Lin, Hsin-Chu (TW);
Chih-Sheng Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 13/914,362

(22) Filed: Jun. 10, 2013

(65) Prior Publication Data

US 2013/0334615 A1    Dec. 19, 2013

Related U.S. Application Data

(62) Division of application No. 13/346,411, filed on Jan. 9, 2012, now Pat. No. 8,609,499.

(51) Int. Cl.
*H01L 29/78*    (2006.01)
*H01L 29/66*    (2006.01)

(52) U.S. Cl.
CPC ........ *H01L 29/785* (2013.01); *H01L 29/66795* (2013.01)

(58) Field of Classification Search
CPC ........................ H01I 29/785; H01L 29/66795
USPC ........................................................ 257/401
See application file for complete search history.

(56) References Cited

U.S. PATENT DOCUMENTS

| | | |
|---|---|---|
| 6,709,982 B1 | 3/2004 | Buynoski et al. |
| 6,858,478 B2 | 2/2005 | Chau et al. |
| 6,921,963 B2 | 7/2005 | Krivokapic et al. |
| 7,060,539 B2 | 6/2006 | Chidambarrao et al. |
| 7,129,550 B2 | 10/2006 | Fujiwara et al. |
| 7,300,837 B2 | 11/2007 | Chen et al. |
| 7,470,951 B2 | 12/2008 | Mathew et al. |
| 7,554,165 B2 | 6/2009 | Hokazono |
| 7,692,254 B2 | 4/2010 | Anderson et al. |
| 7,851,865 B2 | 12/2010 | Anderson et al. |

(Continued)

FOREIGN PATENT DOCUMENTS

| | | |
|---|---|---|
| JP | 2005051241 A | 2/2005 |
| JP | 2011103450 A | 5/2011 |

(Continued)

*Primary Examiner* — Mary Wilczewski
(74) *Attorney, Agent, or Firm* — Slater & Matsil, L.L.P.

(57) ABSTRACT

A method includes forming a gate stack including a gate electrode on a first semiconductor fin. The gate electrode includes a portion over and aligned to a middle portion of the first semiconductor fin. A second semiconductor fin is on a side of the gate electrode, and does not extend to under the gate electrode. The first and the second semiconductor fins are spaced apart from, and parallel to, each other. An end portion of the first semiconductor fin and the second semiconductor fin are etched. An epitaxy is performed to form an epitaxy region, which includes a first portion extending into a first space left by the etched first end portion of the first semiconductor fin, and a second portion extending into a second space left by the etched second semiconductor fin. A first source/drain region is formed in the epitaxy region.

20 Claims, 17 Drawing Sheets

(56) References Cited

U.S. PATENT DOCUMENTS

| | | |
|---|---|---|
| 7,872,303 B2 | 1/2011 | Chan et al. |
| 7,919,816 B2 | 4/2011 | Gossner et al. |
| 7,927,938 B2 | 4/2011 | El-Kareh et al. |
| 8,030,736 B2 | 10/2011 | Booth, Jr. et al. |
| 8,207,038 B2 | 6/2012 | Cheng et al. |
| 8,263,451 B2 | 9/2012 | Su et al. |
| 8,354,311 B2 | 1/2013 | Forbes |
| 8,362,568 B2 | 1/2013 | Lin et al. |
| 8,367,498 B2 | 2/2013 | Chang et al. |
| 8,394,684 B2 | 3/2013 | Kanakasabapathy et al. |
| 8,399,938 B2 | 3/2013 | Cheng et al. |
| 8,609,499 B2 | 12/2013 | Ho et al. |
| 8,759,184 B2 | 6/2014 | Ho et al. |
| 2005/0093154 A1 | 5/2005 | Kottantharayil et al. |
| 2005/0242395 A1 | 11/2005 | Chen et al. |
| 2006/0166456 A1 | 7/2006 | Fujiwara et al. |
| 2008/0096355 A1 | 4/2008 | Jang et al. |
| 2009/0020819 A1 | 1/2009 | Anderson et al. |
| 2009/0127592 A1 | 5/2009 | El-Kareh et al. |
| 2009/0315112 A1 | 12/2009 | Lee |
| 2010/0052059 A1 | 3/2010 | Lee |
| 2010/0133614 A1 | 6/2010 | Beyer et al. |
| 2011/0068407 A1 | 3/2011 | Yeh et al. |
| 2011/0073952 A1 | 3/2011 | Kwok et al. |
| 2011/0079829 A1 | 4/2011 | Lai et al. |
| 2011/0095378 A1 | 4/2011 | Lee et al. |
| 2011/0101455 A1 | 5/2011 | Basker et al. |
| 2011/0133292 A1 | 6/2011 | Lee et al. |
| 2011/0147812 A1 | 6/2011 | Steigerwald et al. |
| 2012/0091528 A1 | 4/2012 | Chang et al. |
| 2012/0104472 A1 | 5/2012 | Xu et al. |
| 2013/0052801 A1 | 2/2013 | Berliner et al. |
| 2013/0056827 A1 | 3/2013 | Tsai et al. |
| 2013/0175584 A1 | 7/2013 | Ho et al. |
| 2013/0175638 A1 | 7/2013 | Ho et al. |
| 2014/0239414 A1 | 8/2014 | Ho et al. |

FOREIGN PATENT DOCUMENTS

| | | |
|---|---|---|
| KR | 20060027640 A | 3/2006 |
| KR | 101051180 | 6/2006 |
| KR | 20060079329 A | 7/2006 |
| KR | 100857087 B1 | 9/2008 |
| KR | 20110033033 A | 3/2011 |
| KR | 20110065326 A | 6/2011 |

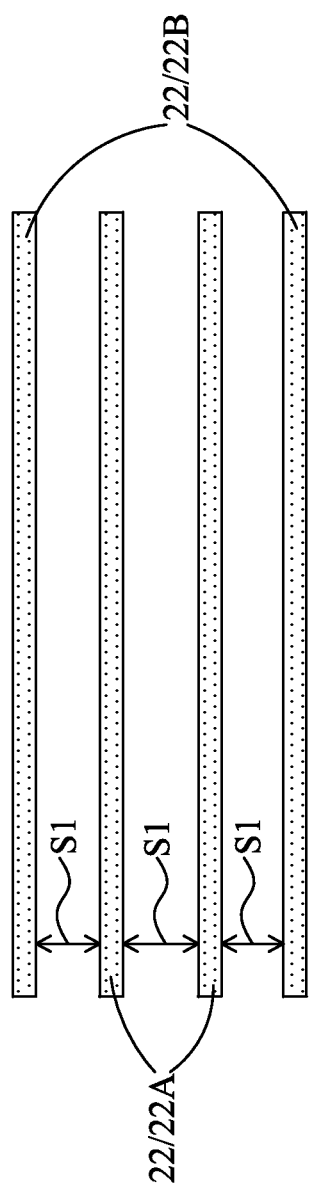

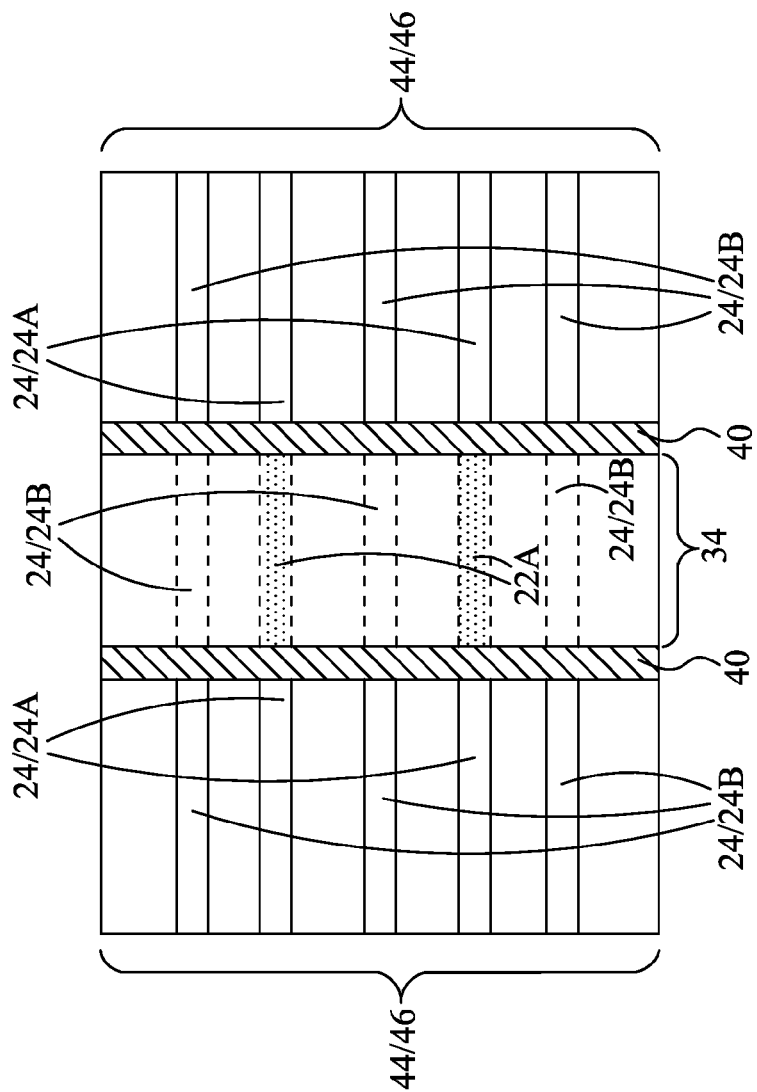

FINFETS AND THE METHODS FOR FORMING THE SAME

This application is a divisional application of U.S. patent application Ser. No. 13/346,411, filed on Jan. 9, 2012 and entitled "FinFETs and the Methods for Forming the Same."

CROSS-REFERENCE TO RELATED APPLICATION

This application relates to the commonly-assigned U.S. patent application Ser. No. 13/346,445, filed on Jan. 9, 2012 and entitled "FinFETs and the Methods for Forming the Same," which applications are hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFET) were thus developed. FinFET transistors have increased channel widths. The increase in the channel width is achieved by forming channels that include portions on the sidewalls of the fins and portions on the top surfaces of the fins. A FinFET may be a double-gate FET, which includes channels on the sidewalls of the respective fin, but no channel on the top surface of the respective fin. A FinFET may also be a triple-gate FET, which includes channels on the sidewalls and the top surface of the respective fin. Since the drive currents of transistors are proportional to the channel widths, the drive currents of the FinFETs are increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) and the methods of forming the same are provided in accordance with various embodiments. The intermediate stages of forming the FinFET are illustrated. The variations of the FinFET in accordance with embodiments are discussed. Throughout the various views and illustrative embodiments, like reference numbers are used to designate like elements.

FIGS. 1 through 5B are cross-sectional views, top views, and perspective views of intermediate stages in the manufacturing of a FinFET in accordance with some exemplary embodiments. FIGS. 1A and 1B illustrate a top view and a perspective view, respectively, of a structure. Referring to FIG. 1A, a plurality of semiconductor fins 22 is formed. Semiconductor fins 22 may be parallel to each other. Also, the respective ends of semiconductor fins 22 may be aligned to each other. In some embodiments, semiconductor fins 22 have a uniform spacing, and spacings S1 between neighboring semiconductor fins 22 may be equal to each other. In alternative embodiments, spacings S1 between neighboring semiconductor fins 22 may be different from to each other.

Figure 1B:
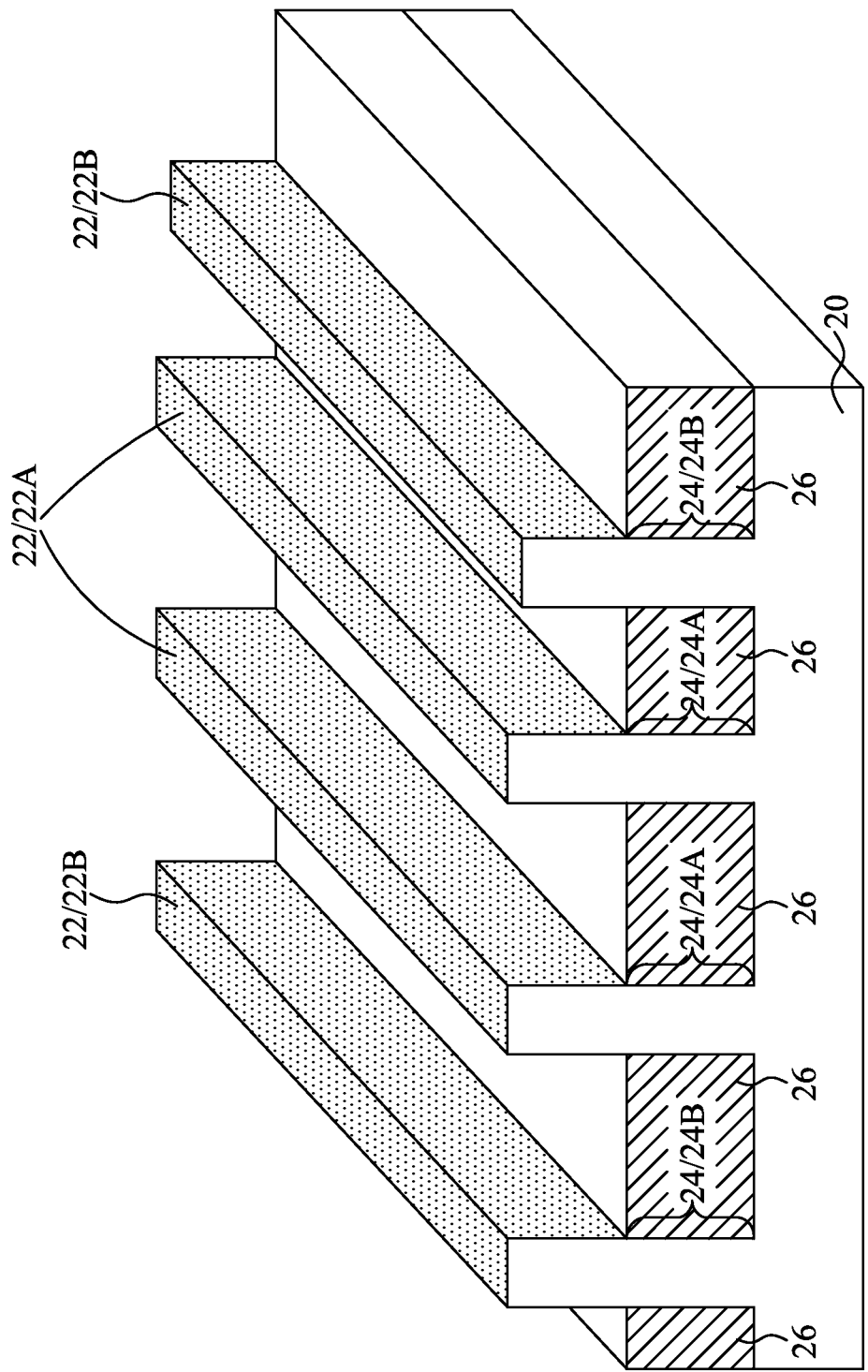
FIGS. 1A through 5B are cross-sectional views, top views, and perspective views of intermediate stages in the manufacturing of a Fin Field-Effect Transistor (FinFET) in accordance with some exemplary embodiments.

FIG. 1B illustrates a perspective view of a portion of the structure shown in FIG. 1A. The structure includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 26 may be formed in substrate 20. The portions of substrate 20 between neighboring STI regions 26 form semiconductor strips 24. The top surfaces of semiconductor strips 24 and the top surfaces of STI regions 26 are substantially level with each other. In some exemplary embodiments, the edges of semiconductor fins 22 are vertically aligned to the respective edges of the corresponding semiconductor strips 24, and are aligned to the edges of STI regions 26. Semiconductor fins 22 and semiconductor strips 24 may be formed of a same semiconductor material.

Figure 2A:
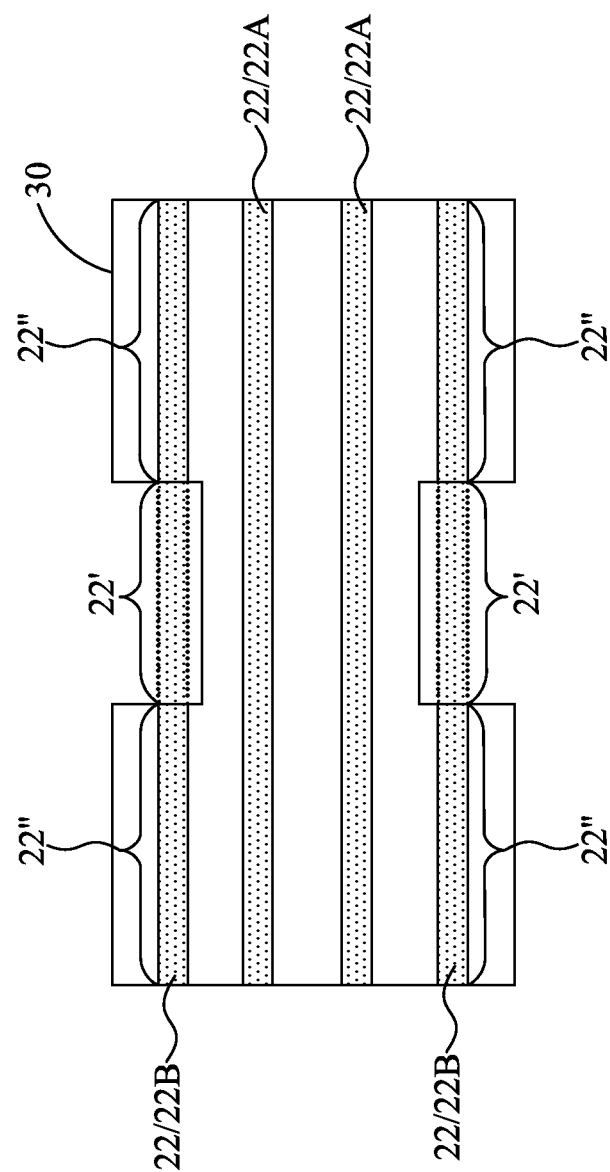

Referring to FIG. 2A, a patterning is performed to etch the middle portions of some of semiconductor fins 22, while some other portions of semiconductor fins 22 are not etched. FIG. 2A is a top view. Throughout the description, the un-etched semiconductor fins 22 are referred to as semiconductor fins 22A, and the etched semiconductor fins 22 are referred to as semiconductor fins 22B. Similarly, semiconductor strips 24 that are underlying and aligned to semiconductor fins 22A are referred to as semiconductor strips 24A, and semiconductor strips 24 that are underlying and aligned to semiconductor fins 22B are referred to as semiconductor strips 24B. To perform the etching step, an etching mask, such as photo resist 30, may be formed and patterned. Photo resist 30 covers entireties of semiconductor fins 22A and the end portions of semiconductor fins 22B. The middle portions of semiconductor fins 22B are not covered by photo resist 30. Using photo resist 30 as the etching mask, the middle portions 22' of semiconductor fins 22B are removed, and opposite end portions 22" of semiconductor fins 22B remain not etched.

Figure 2B:
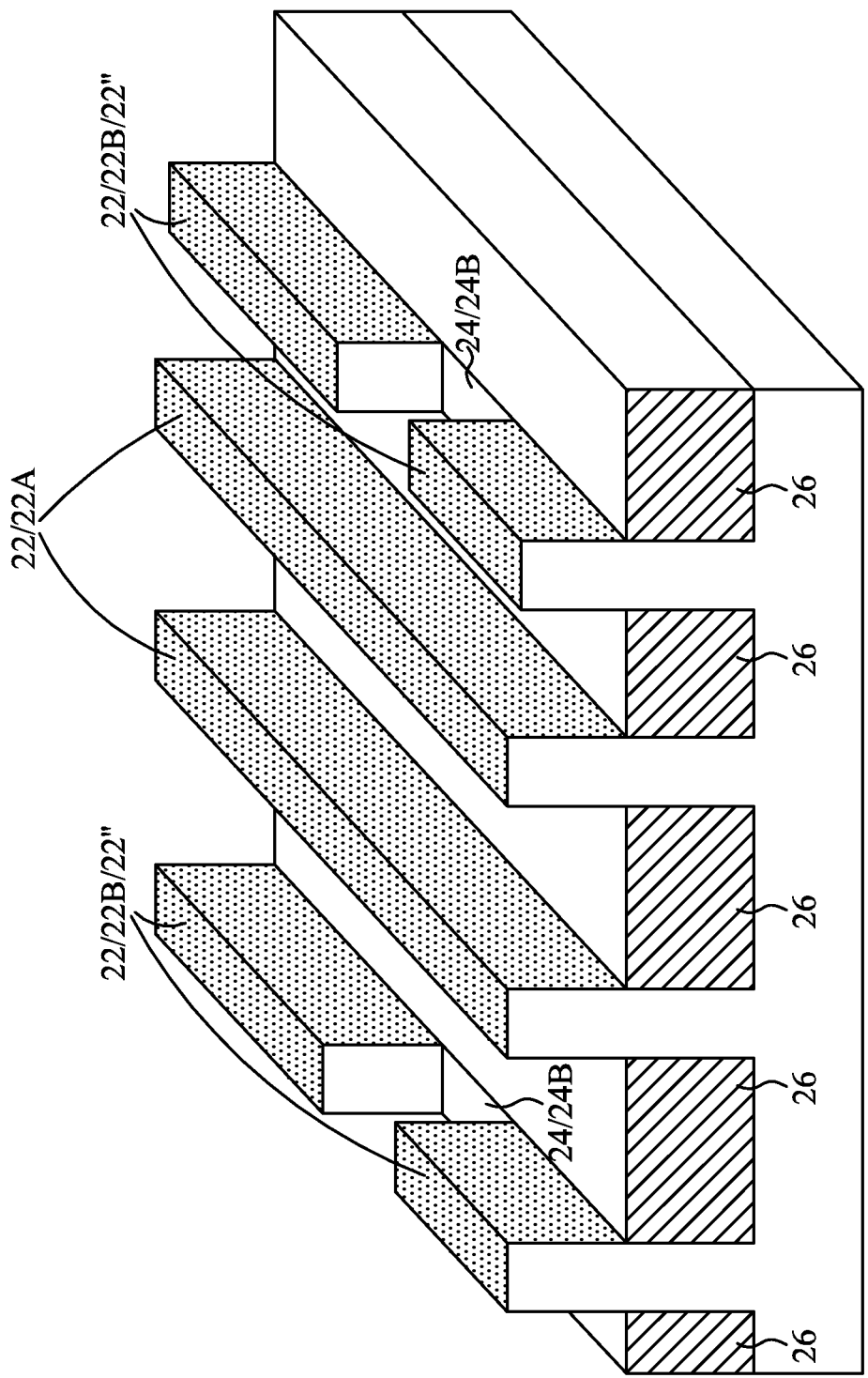

FIG. 2B illustrates a perspective view of the structure after middle portions 22' of semiconductor fins 22B are removed. In some embodiments, after the etching, middle portions 22' are removed substantially fully, and the portions of underlying semiconductor strips 24B underlying middle portions 22' are not removed. After the etching, the exposed top surfaces of the portions of semiconductor strips 24 underlying middle portions 22' are substantially level with the top surfaces of STI regions 26, as illustrated in FIG. 3B. In alternative embodiments, the top surfaces of the portions of semiconductor strips 24B underlying middle portions 22' may be lower than the top surfaces of STI regions 26. After the etching of semiconductor fins 22B, etching mask 30 is removed.

In accordance with some embodiments, the total count of semiconductor fins 22A, which are not etched, may be any integer equal to or greater than 1. The total count of semiconductor fins 22B, which are etched, may also be any integer equal to or greater than 1. Semiconductor fins 22A and 22B may also be disposed in various layouts. For example, semiconductor fins 22A may be disposed symmetrically. Alternatively, semiconductor fins 22A and semiconductor fins 22B may be disposed non-symmetrically.

Figure 3A:
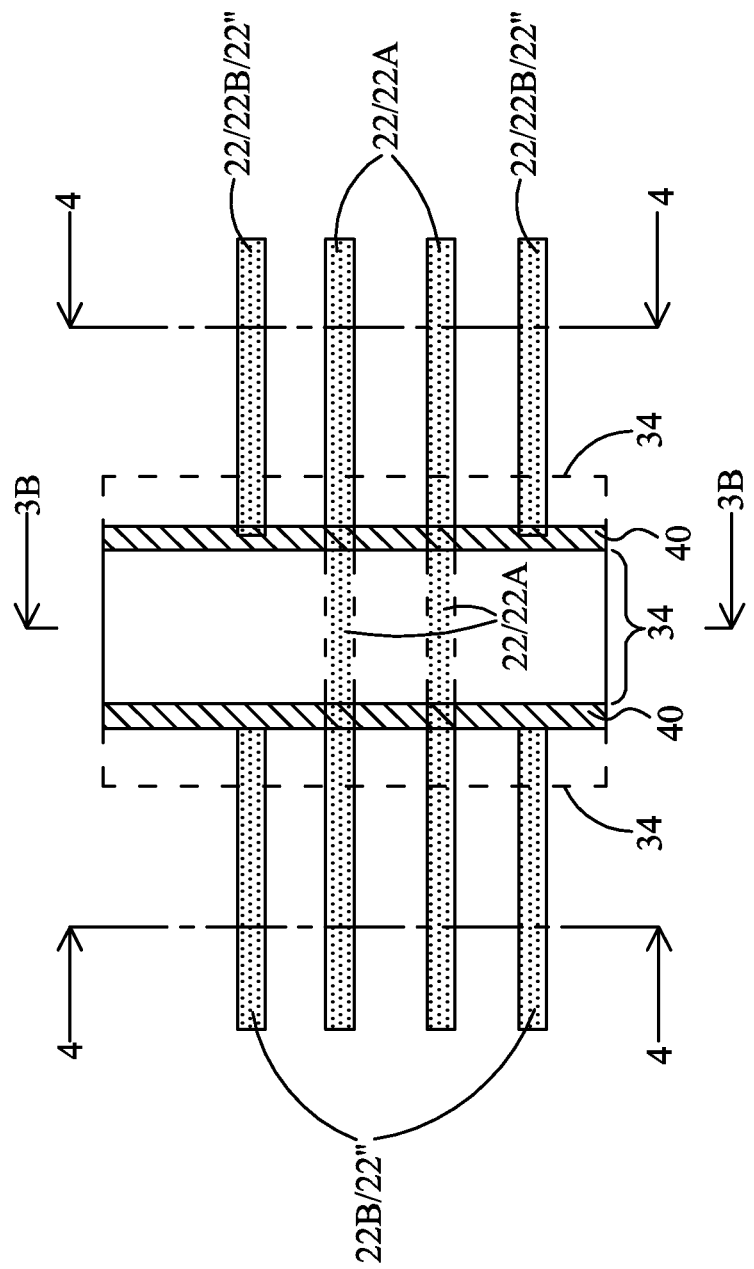
Figure 3B:
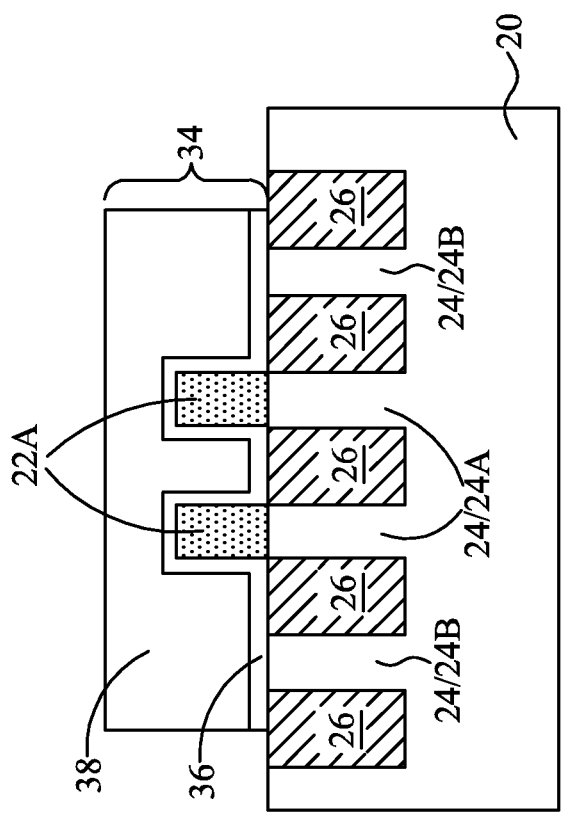

FIG. 3A illustrates a top view of gate stack 34, which is formed to cover the middle portions of semiconductor fins 22A. The opposite end portions of semiconductor fins 22A may not be covered. In addition, at least some, and possibly an entirety, of each of end portions 22" of semiconductor fins 22B are not covered. In some embodiments, as shown using solid lines, gate stack 34 does not cover end portions 22" of semiconductor fins 22B. Alternatively, as shown by the gate stack 34 illustrated using dashed lines, gate stack 34 extends on end portions 22" of semiconductor fins 22B. After the formation of gate stack 34, gate spacers 40 may be formed on the sidewalls of gate stack 34.

FIG. 3B illustrates a cross-sectional view of the structure shown in FIG. 3A, wherein the cross-sectional view is obtained from the plane crossing line 3B-3B in FIG. 3A. As shown in FIG. 3B, gate stack 34 includes gate dielectric 36, which extends on the opposite sidewalls and the top surface of semiconductor fin(s) 22A. Gate dielectric 36 may extend on, and may be in contact with, the top surfaces of semiconductor strips 24B. Furthermore, the interface between gate dielectric 36 and semiconductor strips 24B may be substantially level with the top surface of STI regions 26. Gate dielectric 36 may comprise silicon oxide, silicon nitride, high-k dielectric materials, combinations thereof, and multi-layers thereof. Gate electrode 38 is formed over gate dielectric 36. In some embodiments, gate electrode 38 comprises metals, metal silicides, or other conductive materials. Alternatively, gate electrode 38 may comprise polysilicon. It is appreciated that in the illustrated FIG. 3A, gate stack 34 includes portions over fins 22 and portions on the sidewalls of fins 22. The resulting FinFET may thus be a triple-gate FinFET. In alternative embodiments, gate stack 34 may include portions on the sidewalls of fins 22, and does not include portions over fins 22. The resulting FinFET may thus be a double-gate FinFET. The formation of gate dielectric 36 and gate electrode 38 may comprise forming a blanket gate dielectric layer, forming a blanket gate electrode layer over the blanket gate dielectric layer, and patterning the blanket gate dielectric layer and the blanket gate electrode layer to form gate dielectric 36 and gate electrode 38, respectively.

Figure 8:
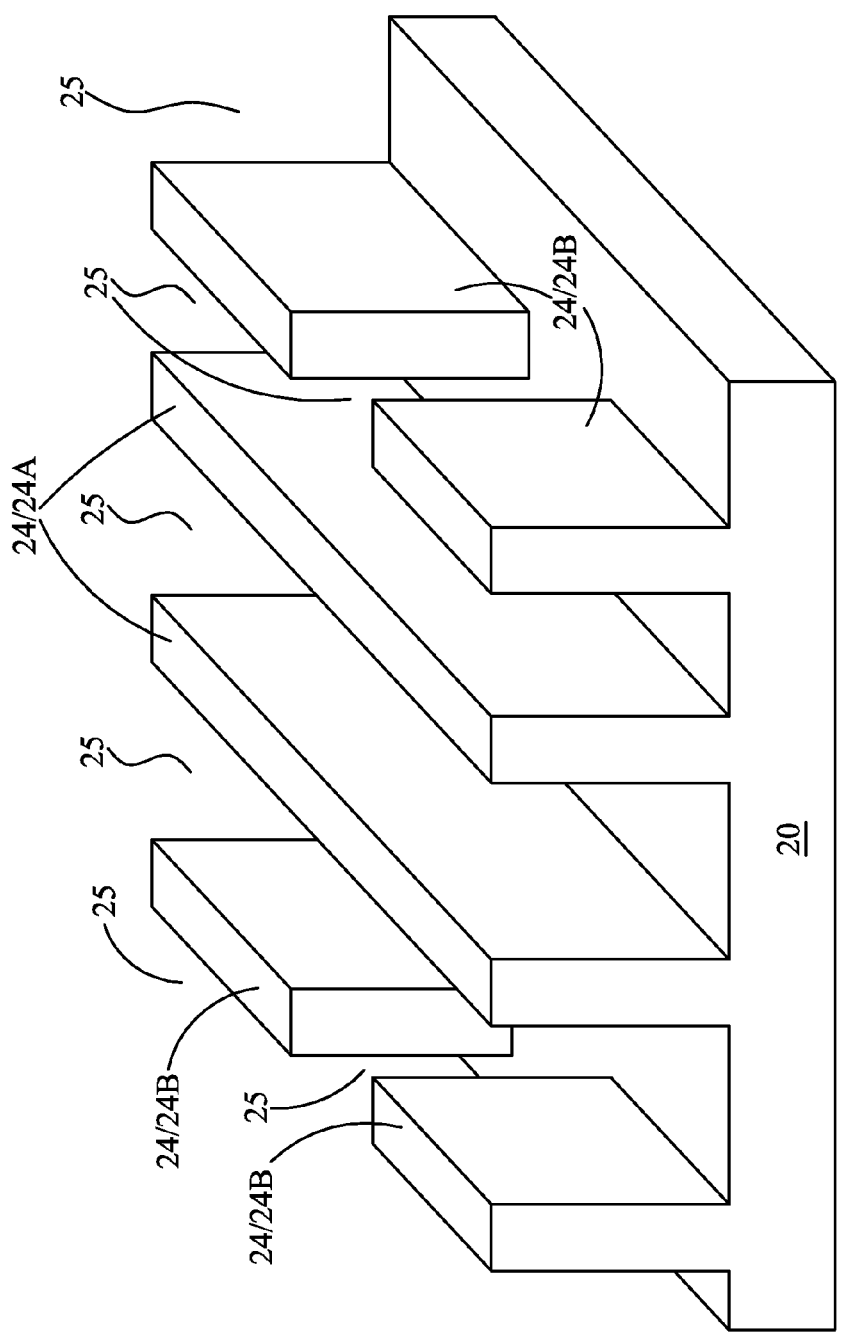
FIGS. 8 through 11 illustrate cross-sectional views in the manufacturing of fins in accordance with some exemplary embodiments.
Figure 9:
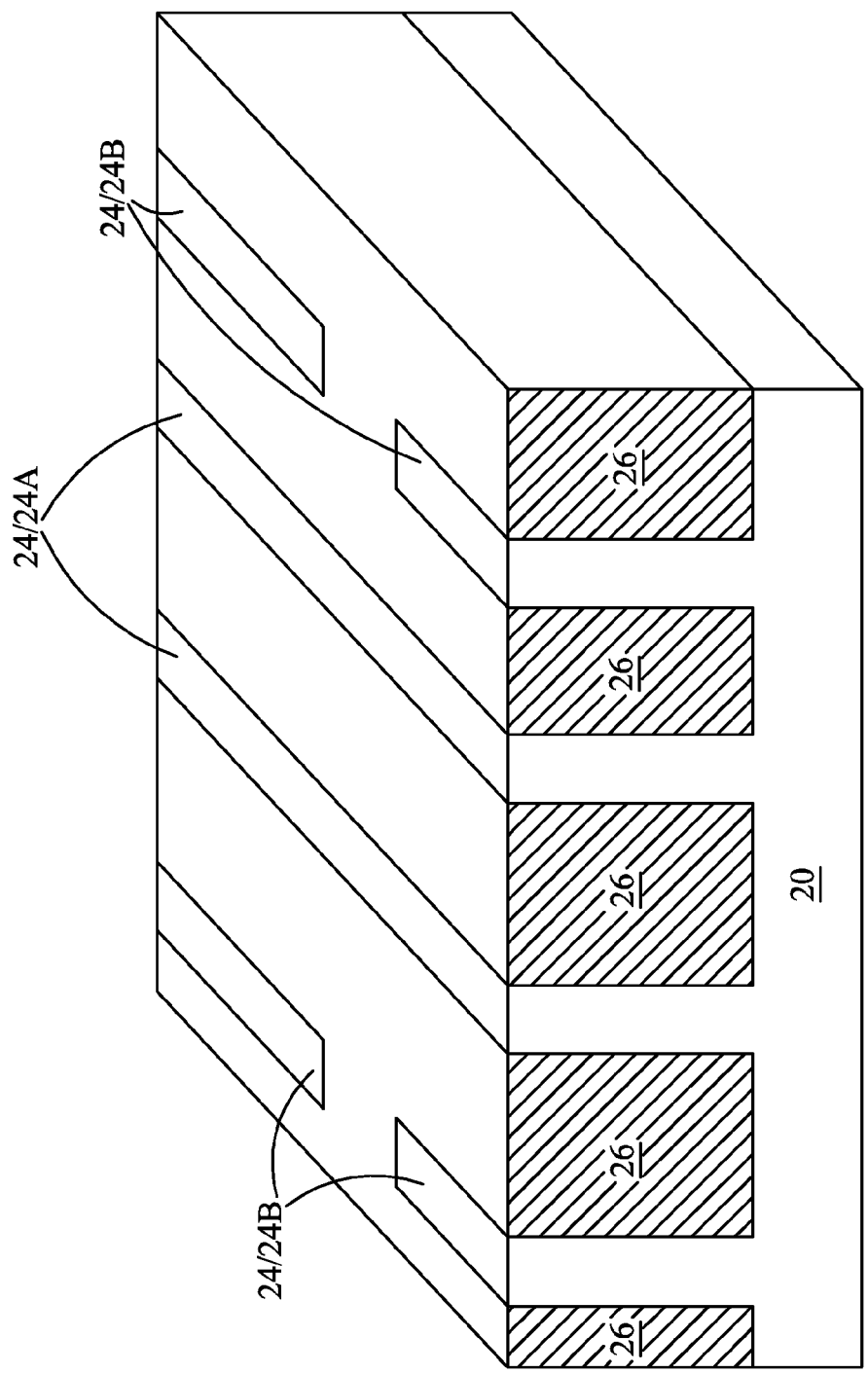
Figure 10:
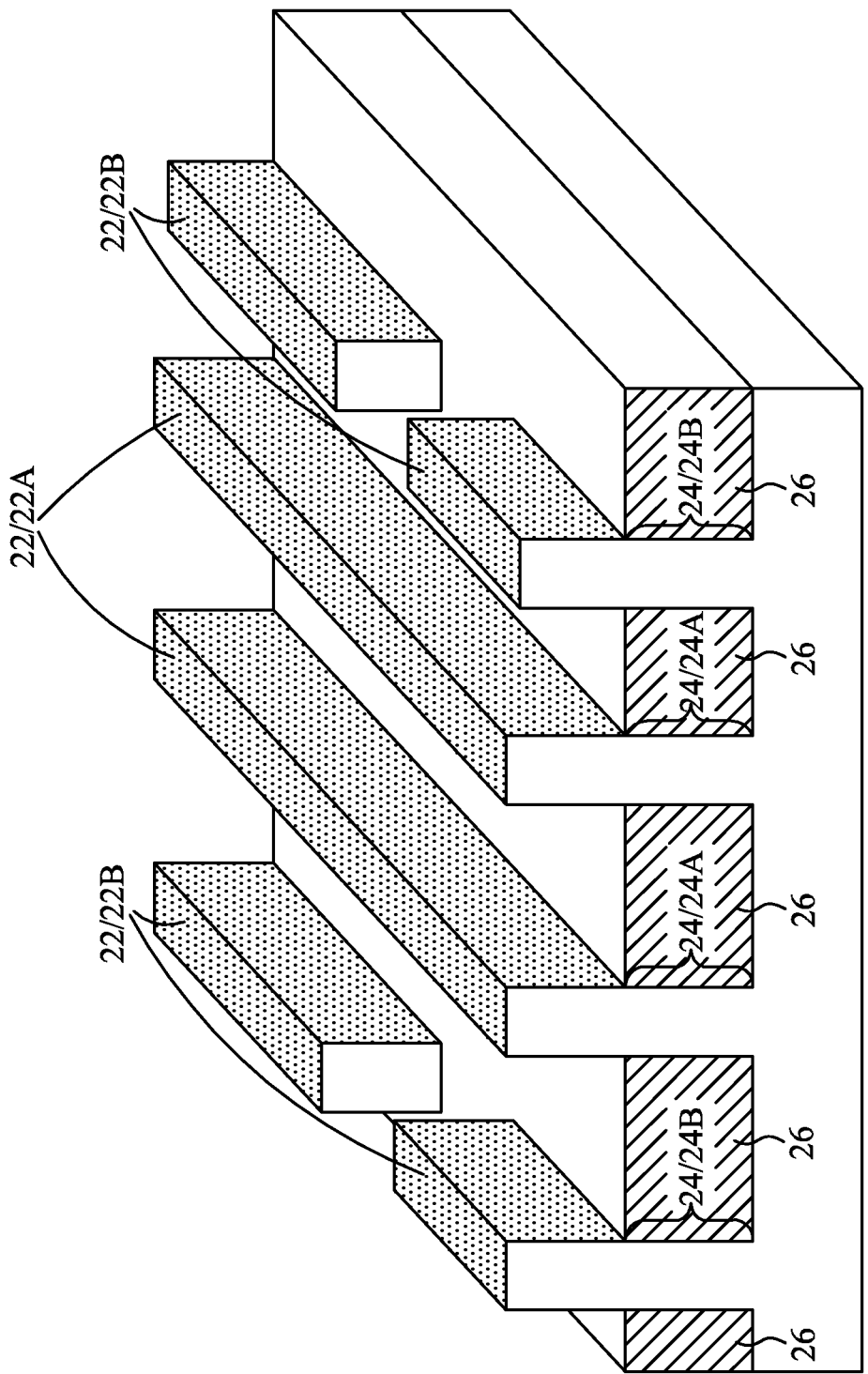
Figure 11:
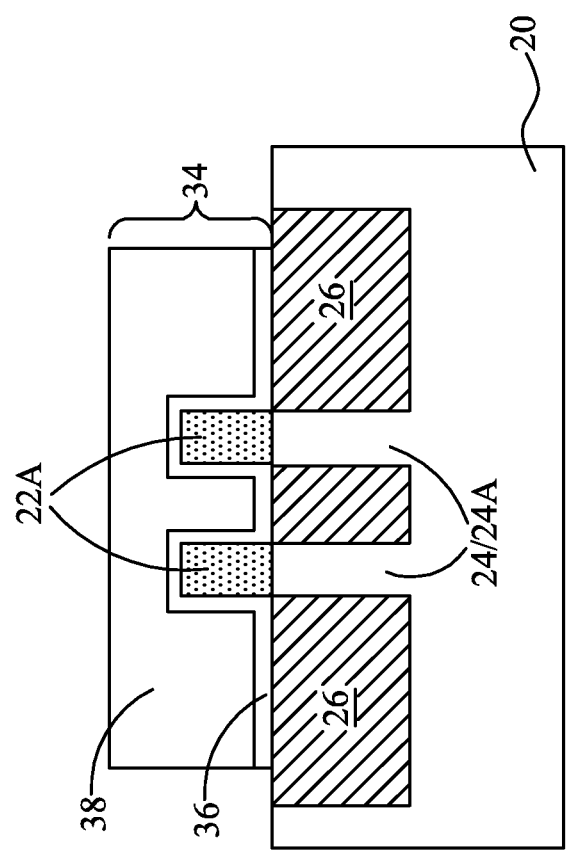

FIGS. 8 through 11 illustrate alternative embodiments for forming a structure similar to the structure shown in FIGS. 2B and 3B. Referring to FIG. 8, a recessing step is performed to form trenches 25 in semiconductor substrate 20. Semiconductor strips 24A and 24B are thus formed. Two semiconductor strips 24B that are aligned to a straight line are separated from each other by one of trenches 25. Next, referring to FIG. 9, STI regions 26 are formed in trenches 25. The top surfaces of STI regions 26 are level with the top surfaces of semiconductor strips 24A and 24B. FIG. 10 illustrates the recessing of STI regions 26, wherein portions of semiconductor strips 24A and 24B over the top surfaces of STI regions 26 form semiconductor fins 22A and 22B, respectively. It is noted that in the structure shown in FIG. 10, each pair of semiconductor strips 24B that is aligned to a straight line is separated from each other by a portion of STI regions 26. FIG. 11 illustrates a cross-sectional view of the structure after the formation of gate stack 34. FIG. 11 is obtained from the plane crossing line 3B/3B in FIG. 3A.

Figure 4:
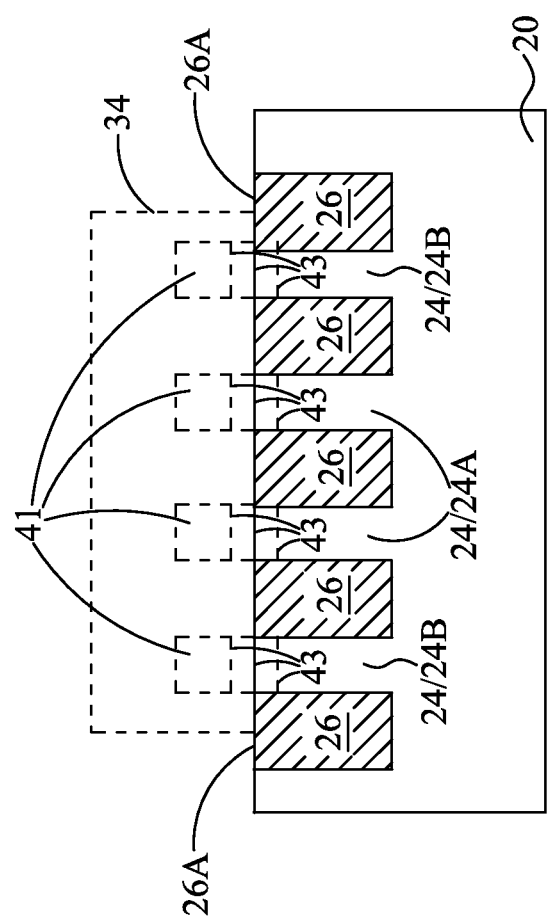
Figure 5A:
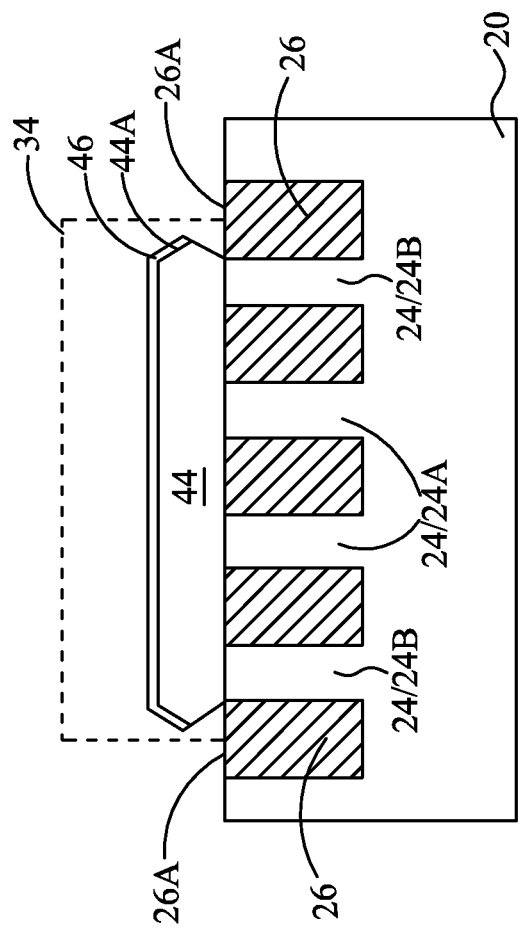
Figure 5B:
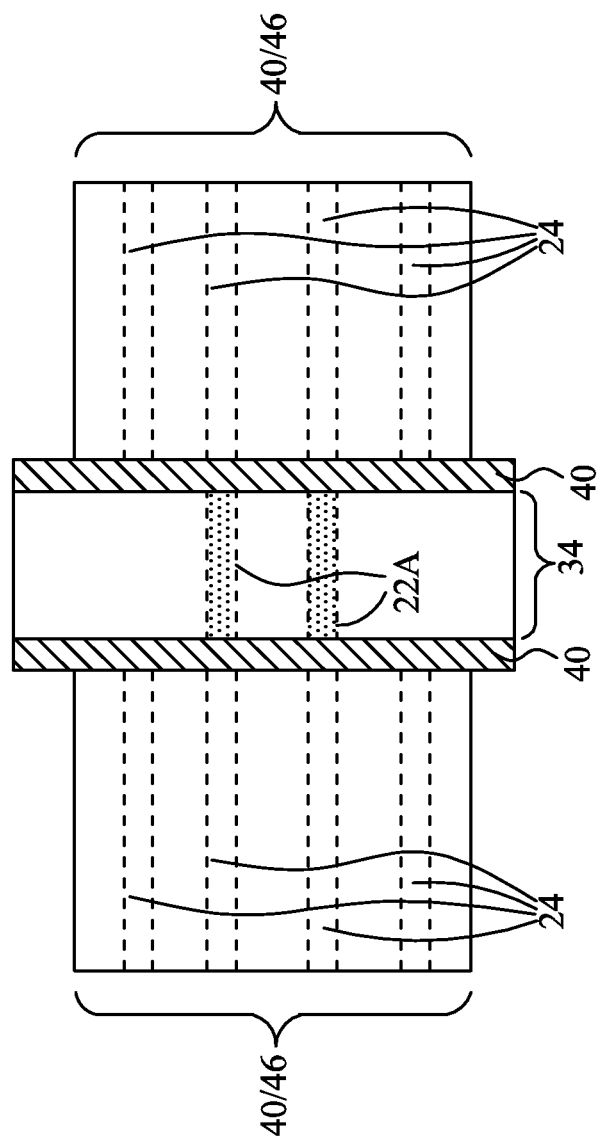

FIGS. 4, 5A, and 5B illustrate the formation of source and drain regions (referred to as source/drain regions hereinafter) 44 (FIG. 5A) and source and drain silicide regions (referred to as source/drain silicide regions hereinafter) 46. The cross-sectional views in FIGS. 4 and 5A are obtained from the same plane crossing lines 4-4 in FIG. 3A. In FIGS. 4 and 5A, gate stack 34 is illustrated using dashed lines since it is not in the planes of FIGS. 4 and 5A. Referring to FIG. 4, the portions of semiconductor fins 22A and 22B (FIG. 3A) not covered by gate stack 34 and gate spacers 40 are recessed. The spaces left by the etched portions of fins 22A and 22B are referred to as recesses 41 hereinafter. Lines 43 illustrate some exemplary positions of the top surfaces of semiconductor fins 22 or semiconductor strips 24 after the recessing. In some embodiments, substantially all exposed portions of semiconductor fins 22A and 22B are etched, and semiconductor strips 24A and 24B are not recessed. In alternative embodiments, the upper portions of the exposed portions of semiconductor fins 22A and 22B are etched, and the lower portions of semiconductor fins 22A and 22B remain not etched. In yet other embodiments, all exposed portions of semiconductor fins 22A and 22B are etched, and the top portions of semiconductor strips 24A and 24B are also recessed, so that the resulting recesses 41 extend to below top surfaces 26A of STI regions 26.

As shown in FIG. 5A, an epitaxy is performed to epitaxially grow epitaxy region 44, for example, using Selective Epitaxy Growth (SEG), wherein epitaxy region 44 is selectively grown from the exposed surfaces of semiconductor strips 24 or the remaining portions of semiconductor fins 22A and 22B, if any. The epitaxy material grown from neighboring semiconductor strips 24 or semiconductor fins 22 may merge with each other to from a continuous epitaxy region 44. As a result, the resulting epitaxy region 44 extends to over and aligned to semiconductor strips 24A and 24B. Epitaxy region 44 may comprise silicon germanium, silicon carbon, silicon with no germanium and carbon added therein, or other semiconductor materials. Epitaxy region 44 may have facets 44A that are neither parallel to nor perpendicular to top surfaces 26A of STI regions 26. After the epitaxy to form epitaxy region 44, a source/drain implantation may be performed to form a source/drain region, which is also denoted as 44. Source/drain silicide region 46 may then be formed on source/drain region 44.

FIG. 5B illustrates a top view of the structure shown in FIG. 5A; it is observed that epitaxy source/drain regions 44 may expand to over semiconductor fins 22A and semiconductor fins 22B. Further, epitaxy source/drain regions 44 are formed on opposite ends of semiconductor fins 22A. Since semiconductor fins 22B were etched in the step shown in FIGS. 2A and 2B, there are no semiconductor fins 22B left under gate stack 34. Accordingly, the source-to-drain current of the respective FinFET needs to flow through the remaining semiconductor fins 22A, which form the channel regions of the resulting FinFET.

FIGS. 6A through 7B illustrate top views in the intermediate stages in the formation of FinFETs in accordance with alternative embodiments. Unless specified otherwise, the materials and formation methods of the components in these embodiments are essentially the same as the like components, which are denoted by like reference numerals in the embodiments shown in FIGS. 1 through 5B. The formation details of the embodiment shown in FIGS. 6A through 7B may thus be found in the discussion of the embodiments shown in FIGS. 1 through 5B.

Figure 6A:
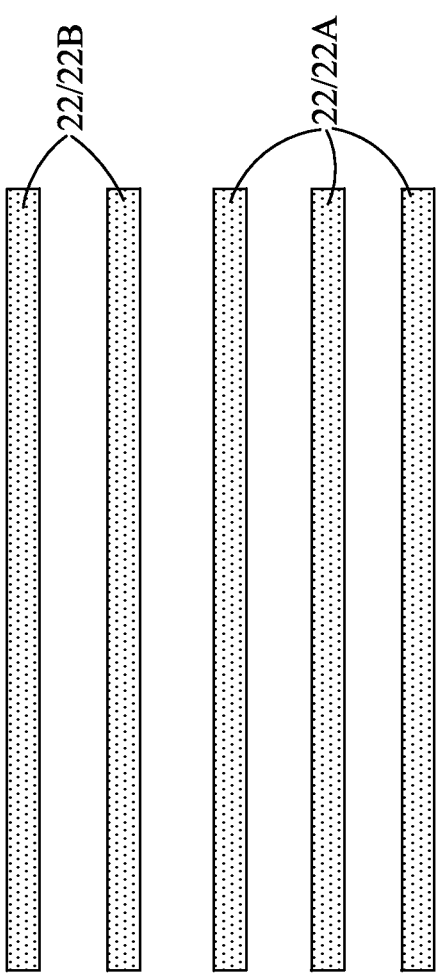
FIGS. 6A through 7B are top views of FinFETs in accordance with exemplary embodiments.
Figure 6B:
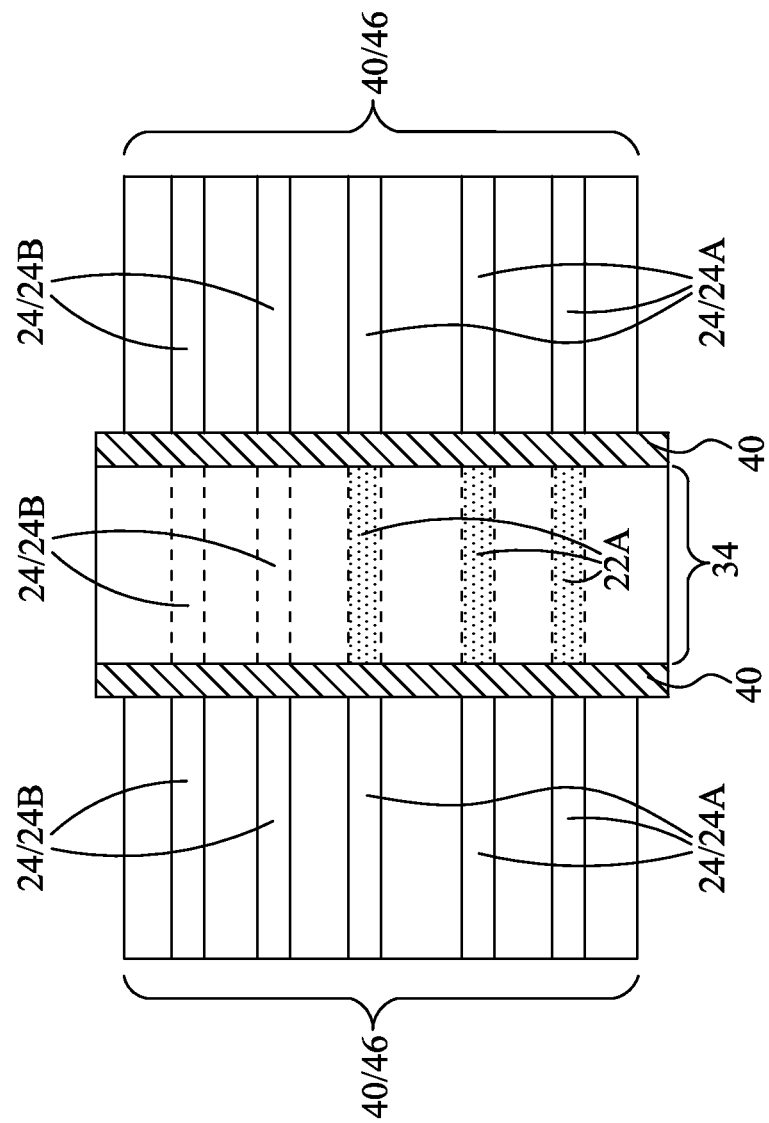

Referring to FIG. 6A, a plurality of semiconductor fins 22B is adjacent to each other to form a fin group. A plurality of semiconductor fins 22A is adjacent to each other, with semiconductor strips 24A under semiconductor fins 22A. A plurality of semiconductor fins 22B is adjacent to each other, and is on a side of the plurality of semiconductor fins 22A. Semiconductor strips 24B are located under semiconductor fins 22B. In a step similar to the step shown in FIGS. 2A and 2B, the middle portions of semiconductor fins 22B are etched, so that each of semiconductor fins 22B have two end portions that are disconnected from each other. Semiconductor fins 22A are not etched in this etching step. In subsequent process steps (similar to the steps in 3A through 5B), gate stack 34 and gate spacers 40 are formed, followed by the formation of epitaxy source/drain regions 44 and source/drain silicide regions 46. The resulting structure is shown in FIG. 6B.

Figure 7A:
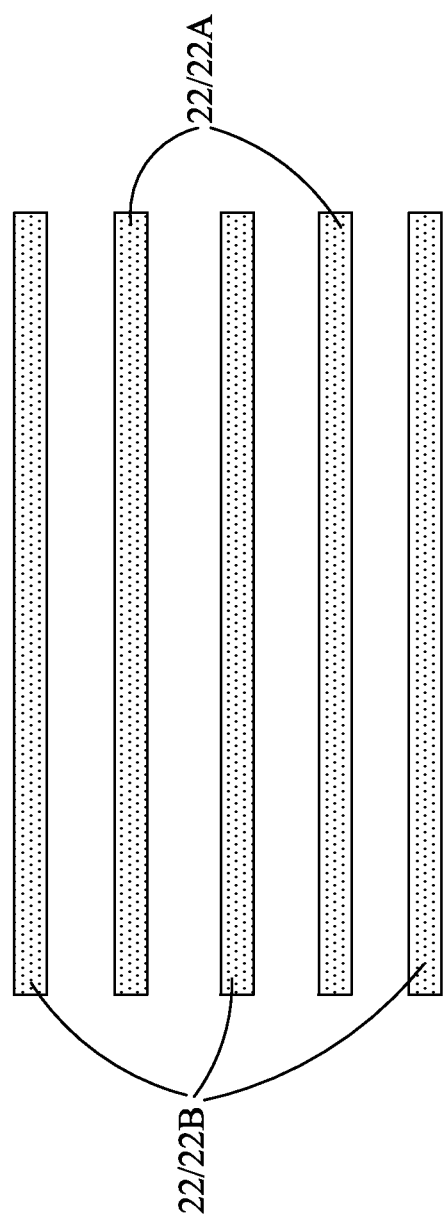

Referring to FIG. 7A, semiconductor fins 22A and semiconductor fins 22B are disposed in an alternating pattern. Semiconductor strips 24A and 24B being under semiconductor fins 22A and 22B, respectively. In a step similar to the step shown in FIGS. 2A and 2B, the middle portions of semiconductor fins 22B are etched, so that the opposite end portions of each of semiconductor fins 22B are disconnected from each other. Semiconductor fins 22A are not etched in this etching step. In subsequent process steps (which is similar to the steps in 3A through 5B), gate stack 34 and gate spacers 40 are formed, followed by the formation of epitaxy source/drain regions 44 and source/drain silicide regions 46. The resulting structure is shown in FIG. 7B.

In the embodiments, semiconductor fins 22A form the channel regions of the respective FinFETs. Although semiconductor fins 22B do not form the channel regions, semiconductor fins 22B contribute to the increase in the size of the epitaxy source/drain regions, which in turn contribute to the increase in the saturation currents of the respective FinFETs. Assuming each of additional semiconductor fins 22A results in the saturation current of the respective FinFET to be increased by one unit of current, the formation of each of semiconductor fins 22B may cause the saturation current to be increased by an amount that is less than one unit of current. Accordingly, by forming semiconductor fins 22B, the currents of FinFETs can be modulated to a number that is not equal to the integer number of units of currents. For example, by adding semiconductor fins 22B to two semiconductor fins 22A, the currents of the FinFETs may be adjusted to equal to 2.1, 2.2, or 2.3 times the current generated in a conventional FinFET comprising two fins. When higher saturation currents are needed, additional fins 22B and the underlying semiconductor strips 24B may be added. The fine-adjustment of the currents of FinFETs may be used for customized design requirements, for example, for the fine-adjustment of the current ratio between p-type FinFETs and n-type FinFETs.

In accordance with embodiments, a method includes forming a gate stack including a gate electrode on a first semiconductor fin. The gate electrode includes a portion over and aligned to a middle portion of the first semiconductor fin. A second semiconductor fin is on a side of the gate electrode, and does not extend to under the gate electrode. The first and the second semiconductor fins are spaced apart from, and parallel to, each other. An end portion of the first semiconductor fin and the second semiconductor fin are etched. An epitaxy is performed to form an epitaxy region, which includes a first portion extending into a first space left by the etched first end portion of the first semiconductor fin, and a second portion extending into a second space left by the etched second semiconductor fin. A first source/drain region is formed in the epitaxy region.

In accordance with other embodiments, a method includes providing a structure. The structure includes a semiconductor substrate, isolation regions at a surface of the semiconductor substrate, a first and a second semiconductor fin over the isolation regions and parallel to each other, and a first and a second semiconductor strip underlying and aligned to the first and the second semiconductor fins, respectively. The first and the second semiconductor strips are level with the isolation regions. The method includes etching a middle portion of the first semiconductor fin to separate the first semiconductor fin into two end portions, wherein the second semiconductor fin is covered by an etching mask during the step of etching. A gate dielectric is formed on a top surface and sidewalls of a middle portion of the second semiconductor fin. A gate electrode is formed over the gate dielectric. An epitaxy is performed to form an epitaxy region. The epitaxy region includes a first portion over and aligned to an end portion of the first semiconductor strip and a second portion over and aligned to an end portion of the second semiconductor strip.

In accordance with yet other embodiments, a device includes a semiconductor substrate, isolation regions at a surface of the semiconductor substrate, a first and a second semiconductor strip between the isolation regions and parallel to each other, and a semiconductor fin over and adjoining the first semiconductor strip. A gate dielectric is on sidewalls of the semiconductor fin. Portions of the gate dielectric over and aligned to the second semiconductor strip have bottom surfaces substantially level with a top surface of the isolation regions. A gate electrode is over the gate dielectric, wherein the gate dielectric and the gate electrode form portions of a FinFET. A source/drain region is over and aligned to the first and the second semiconductor strips.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate having a plurality of semiconductor strips extending therefrom, the plurality of semiconductor strips being parallel to each other;
    a dielectric layer over the substrate between adjacent ones of the semiconductor strips, the dielectric layer extending to an upper surface of the semiconductor strips;
    a semiconductor fin extending from a middle portion of a first strip of the plurality of semiconductor strips;
    a gate electrode over the semiconductor fin and on sidewalls of the semiconductor fin, the gate electrode extending over a top surface of the dielectric layer;
    a first source/drain region on a first side of the gate electrode, the first source/drain region extending over and contacting the first strip and another strip of the plurality of semiconductor strips;
    a second source/drain region on a second side of the gate electrode, the second source/drain region extending over and contacting the first strip and the another strip of the plurality of semiconductor strips; and a channel region over the first strip extending between the first source/drain region and the second source/drain region, wherein no channel region extends over the another strip.

2. The device of claim 1, wherein the first and the second source/drain regions comprise facets that are neither parallel to, nor perpendicular to, a top surface of the dielectric layer.

3. The device of claim 1, wherein the first and the second source/drain regions comprise silicon germanium.

4. The device of claim 1, wherein the semiconductor substrate and the semiconductor strips are formed of a same semiconductor material.

5. The device of claim 1, wherein the first strip and the another strip are separated by Shallow Trench Isolation (STI) regions.

6. The device of claim 1, wherein the another strip is discontinuous.

7. The device of claim 1, wherein an edge of the semiconductor fin is vertically aligned to a respective edge of the first strip.

8. The device of claim 1, further comprising gate spacers along sidewalls of the gate electrode.

9. A device comprising:
a semiconductor substrate having a first semiconductor strip and a second semiconductor strip extending therefrom, the first and second semiconductor strip being parallel to each other;
a Shallow Trench Isolation (STI) region disposed between the first semiconductor strip and the second semiconductor strip, a top surface of the first semiconductor strip and a top surface of the second semiconductor strip being lower than or level with a top surface of the STI region;
a first semiconductor fin extending from a middle portion of the first semiconductor strip;
a gate dielectric on sidewalls of the first semiconductor fin, the gate dielectric extending over and contacting a top surface of the second semiconductor strip;
a gate electrode over the gate dielectric; and
an first epitaxy source/drain region on a first side of the gate electrode, comprising:
a first portion extending over and contacting a first end portion of the first semiconductor strip; and
a second portion extending over and contacting a first end portion of the second semiconductor strip, wherein the first and the second portions form a merged source/drain region.

10. The device of claim 9, further comprising:
a second source/drain epitaxy region on a second side of the gate electrode, the second source/drain epitaxy region extending over and contacting a second end portion of the first semiconductor strip and a second end portion of the second semiconductor strip.

11. The device of claim 9, wherein the first semiconductor fin and the semiconductor substrate underlying the first semiconductor fin are formed of a same material.

12. A device comprising:
a substrate having a plurality of semiconductor strips extending therefrom, a first strip of the plurality of semiconductor strips parallel to a second strip and a third strip of the plurality of semiconductor strips, the second strip and the third strip aligned longitudinally with each other, wherein the second strip is separated from the third strip by a gap region;
a dielectric material disposed over the substrate and extending between the plurality of semiconductor strips and extending into the gap region;
at least one semiconductor fin extending from a middle portion of the first strip;
a gate structure over the at least one semiconductor fin, the gate structure comprising a gate dielectric and a gate electrode over the gate dielectric, the gate structure extending into the gap region; and
a source/drain region extending over and contacting an end portion of the first strip and over and contacting the second strip.

13. The device of claim 12, wherein at least one fourth strip of the plurality of semiconductor strips is disposed on a same side of the gate structure as the second strip, the at least one fourth strip parallel to the first strip, the gate structure avoiding overlying the at least one fourth strip.

14. The device of claim 13, wherein the first strip is disposed between the second strip and the at least one fourth strip.

15. The device of claim 13, wherein the at least one fourth strip comprises a plurality of fourth strips, and wherein the source/drain region further extends over and contacts each of the plurality of fourth strips.

16. The device of claim 13, wherein the at least one fourth strip comprises a plurality of fourth strips, and wherein the source/drain region extends over less than all of the plurality of fourth strips.

17. The device of claim 16, wherein the gate structure extends adjacent to at least one of the plurality of fourth strips without overlying the plurality of fourth strips.

18. The device of claim 13, further comprising a plurality of other fins each disposed on respective other ones of the plurality of semiconductor strips, wherein the gate structure extends over each of the plurality of other fins.

19. The device of claim 12, wherein the source/drain region has sidewall facets that are non-perpendicular and non-parallel to a top surface of the dielectric material.

20. The device of claim 12, wherein a top surface of the first strip and a top surface of the second strip are substantially level with a top surface of the dielectric material.

* * * * *